(12) United States Patent
Hanazaki

(10) Patent No.: US 6,644,534 B2
(45) Date of Patent: Nov. 11, 2003

(54) PROCESS FOR JOINING METALS

(75) Inventor: Kenichi Hanazaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/055,924

(22) Filed: Jan. 28, 2002

(65) Prior Publication Data

US 2002/0100792 A1 Aug. 1, 2002

(30) Foreign Application Priority Data

Jan. 29, 2001  (JP) ........................................ 2001-020812

(51) Int. Cl.$^7$ ............................................. H01L 21/607
(52) U.S. Cl. ................. 228/110.1; 228/228; 156/580.1; 156/73.1
(58) Field of Search ............................... 228/110.1, 1.1, 228/227, 228, 229; 156/73.1, 73.2, 580.1, 580.2

(56) References Cited

U.S. PATENT DOCUMENTS

| | | | | |
|---|---|---|---|---|
| 4,842,662 A | * | 6/1989 | Jacobi ...................... | 228/110.1 |
| 5,058,798 A | * | 10/1991 | Yamazaki et al. ........ | 228/110.1 |
| 5,634,586 A | * | 6/1997 | Kimura et al. ........... | 228/110.1 |
| 5,642,852 A | * | 7/1997 | Suzuki et al. ............ | 228/110.1 |
| 5,660,319 A | * | 8/1997 | Falcone et al. .......... | 228/110.1 |
| 6,271,601 B1 | * | 8/2001 | Yamamoto et al. ......... | 257/784 |

* cited by examiner

*Primary Examiner*—M. Alexandra Elve
*Assistant Examiner*—Len Tran
(74) *Attorney, Agent, or Firm*—Armstrong, Westerman & Hattori, LLP

(57) ABSTRACT

A process for joining metals is provided, by which a core wire of a coated electric wire can be securely joined to a metal having a plated layer on the surface thereof. The process is to assemble a wiring module 1. The wiring module 1 has a metal piece 2, a coated electric wire 3 and so on. A plated layer 6 made of tin is formed on a surface of a matrix 5 of the metal piece 2. The coated electric wire 3 has a core wire 7. An ultrasonic welding is carried out after placing a part 7a of the core wire 7 on the plated layer 6 of the metal piece 2. The plated layer 6 is melted so as to join the part 7a of the core wire 7 to the matrix 5 and the core wire 7 is broken off separating the part 7a therefrom. Another ultrasonic welding is carried out after further placing another core wire 7 on the part 7a joined to the matrix 5, so that the core wire 7 of the coated electric wire 3 is joined to the metal piece 2 through the part 7a of the core wire 7.

2 Claims, 5 Drawing Sheets

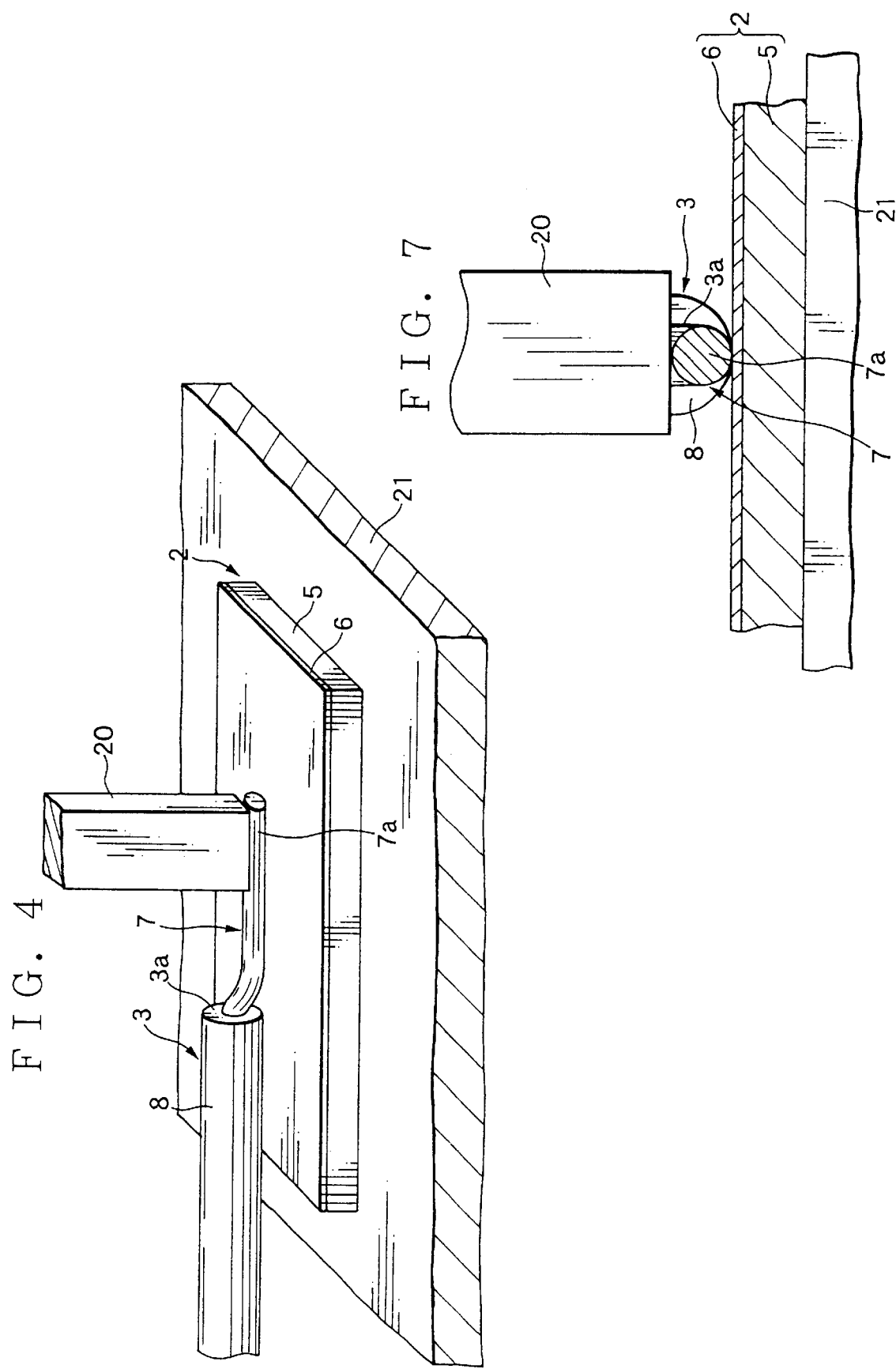

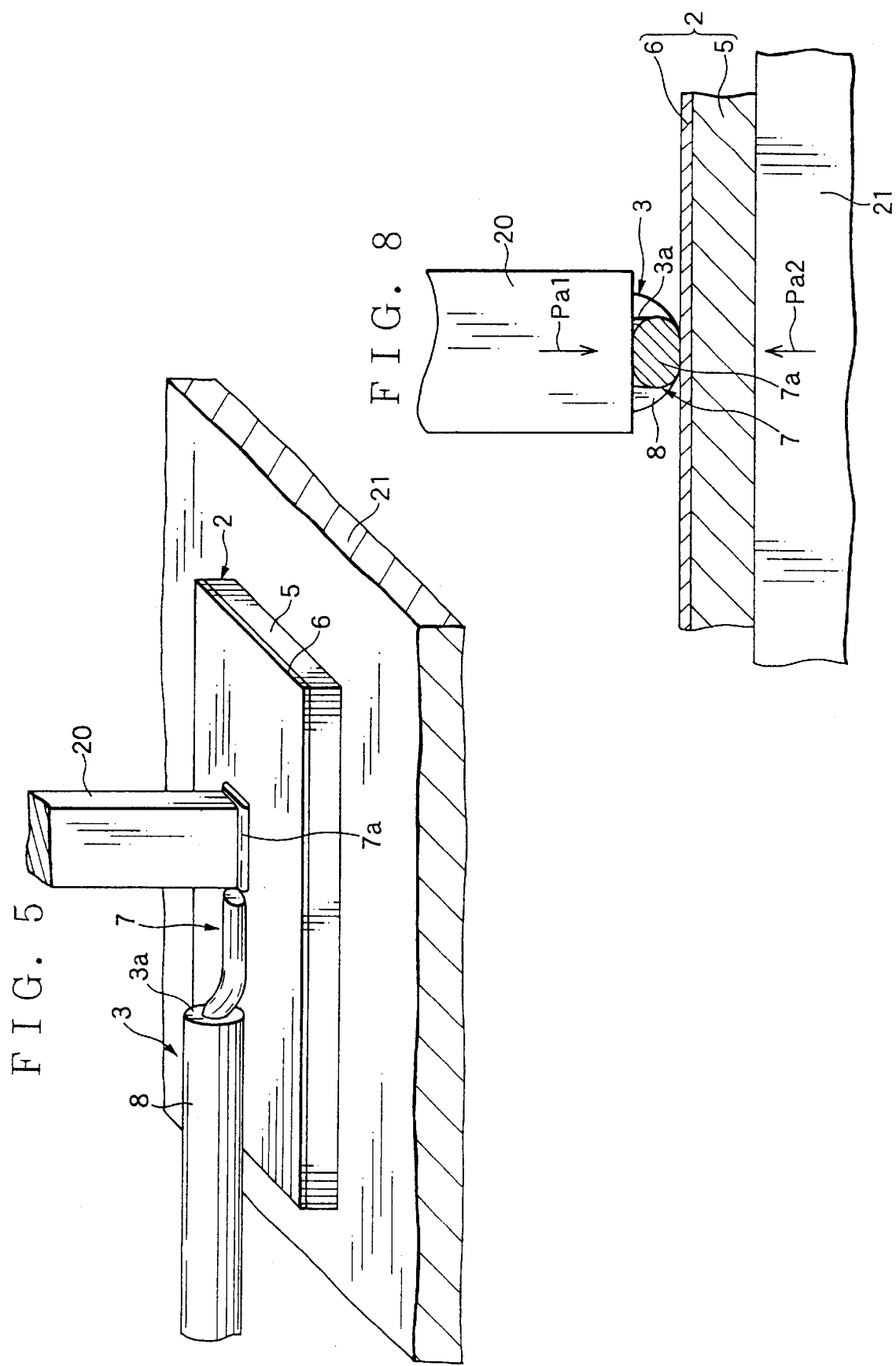

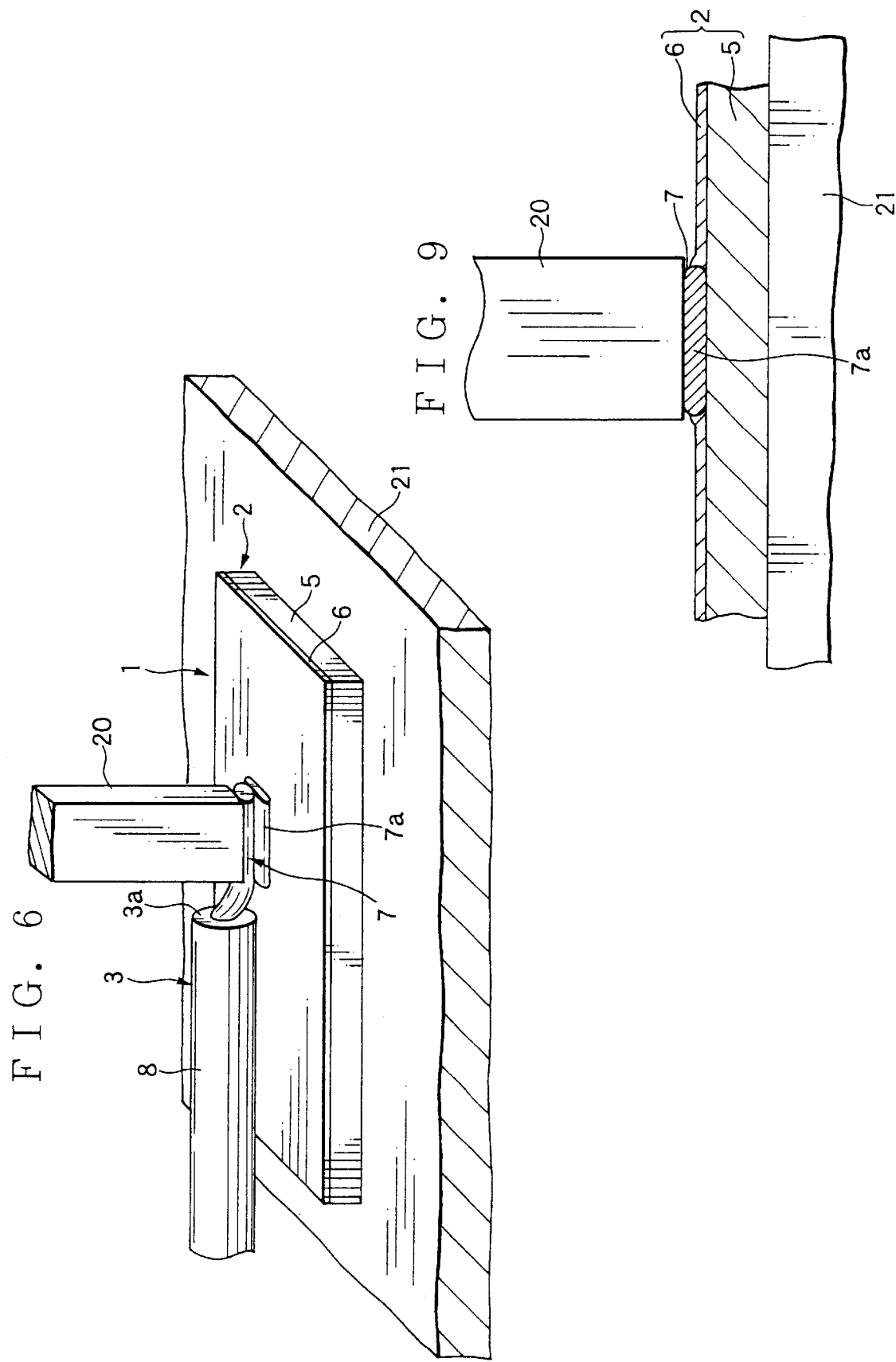

PROCESS FOR JOINING METALS

BACKGROUND OF THE INVENTION (1) Field of the Invention

The present invention relates to a process for joining metals, by which a metal having a plated layer consisting of tin or tin alloy is joined to a core wire of a coated electric wire.

(2) Description of the Related Art

For example, a wiring harness arranged in a motor vehicle has wires (electric wires) and terminal metal fittings to be attached to each end of the wires. The wire consists of a core wire made of metal such as copper and an insulating coating for coating the core wire. The terminal metal fittings consists of a matrix of electrically conductive metal and a plated layer of tin or the like, which is formed on the surface of the matrix.

So far, when the terminal metal fittings and the wire are electrically or mechanically joined to each other, a part of the terminal metal fittings has been caulked to a core wire of the wire. Therefore, for example, when the wiring harness is arranged in a motor vehicle, there has been a possibility that the electric connection between the terminal metal fittings and the wire is cut by the vibration of the motor vehicle upon travelling and so on.

The terminal metal fittings and the wire can be electrically or mechanically joined to each other by brazing with using solder. However, in this case, there also has been a possibility that the electric connection between the terminal metal fittings and the wire is cut by the vibration of the motor vehicle upon travelling or by the corrosion of the solder caused by the aging thereof.

SUMMARY OF THE INVENTION

It is therefore an objective of the present invention to solve the above problem and to provide a process for joining metals, by which a core wire of a coated electric wire can be securely joined to a metal having a plated layer on the surface thereof.

In order to attain the above objective, the present invention is to provide a process for joining metals, by which a core wire of a coated electric wire is joined to a first metal, on the surface of which a plated layer is formed, comprising:

a first welding step, in which an ultrasonic welding is carried out after placing a part of a core wire of the coated electric wire on the plated layer of the first metal, so that the plated layer is melted, the part of the core wire is joined to a matrix of the first metal, and the part of the core wire is broken off from a body of the coated electric wire; and a second welding step, in which an ultrasonic welding is carried out after further placing another core wire of the body of the coated electric wire on the part of the core wire joined to the matrix, so that the two core wires are joined to each other.

With the construction described above, the plated layer is once melted in the first welding step. Therefore, when the ultrasonic welding is carried out, the core wire of the coated electric wire and the first metal are pressed in the direction of approaching to each other, resulting in that the part of the core wire of the coated electric wire is securely joined to the matrix of the first metal. The part of the core wire of the coated electric wire is broken off from the body of the coated electric wire.

Thereafter, in the second welding step, an ultrasonic welding is carried out after further placing another core wire of the body of the coated electric wire on the part of the core wire joined to the matrix, the core wire of the body of the coated electric wire can be securely joined to the part of the core wire.

In this specification, the "broken off" means that the core wire of the coated electric wire is cut and the part of the core wire is separated from the body of the coated electric wire. The expression of "the two core wires are joined to each other" means that the part of the core wire is joined to the another core wire of the body of the coated electric wire.

Preferably, ultrasonic oscillation energy used in the first welding step is higher than that used in the second welding step, and force for pressurization applied in the direction that the core wire and the first metal approach to each other in the first welding step is larger than that in the second welding step.

With the construction described above, by melting the plated layer, the part of the core wire can be securely joined to the matrix of the first metal. Further, when the two core wires are joined to each other, the core wire of the body of the coated electric wire can be prevented from being broken off.

BRIEF DESCRIPTION OF THE DRAWINGS

FIG. 4 is a perspective view illustrating a state that a metal piece and a part of a core wire are pressed in the direction of approaching to each other when the wiring module shown in FIG. 1 is assembled;

FIG. 5 is a perspective view illustrating a state that a part of a core wire is joined to a matrix of a metal piece when the wiring module shown in FIG. 1 is assembled;

FIG. 6 is a perspective view illustrating a state that another core wire is placed on and pressed onto a part of a core wire, which has been joined to a matrix of a metal piece, when the wiring module shown in FIG. 1 is assembled;

FIG. 7 is a cross sectional view illustrating a state that a part of a core wire is placed on a metal piece when the wiring module shown in FIG. 1 is assembled;

FIG. 8 is a cross sectional view illustrating a state that a metal piece and a part of a core wire are pressed in the direction of approaching to each other when the wiring module shown in FIG. 1 is assembled;

FIG. 9 is a cross sectional view illustrating a state that a part of a core wire is joined to a matrix of a metal piece when the wiring module shown in FIG. 1 is assembled;

DESCRIPTION OF THE PREFERRED EMBODIMENTS

Figure 1:
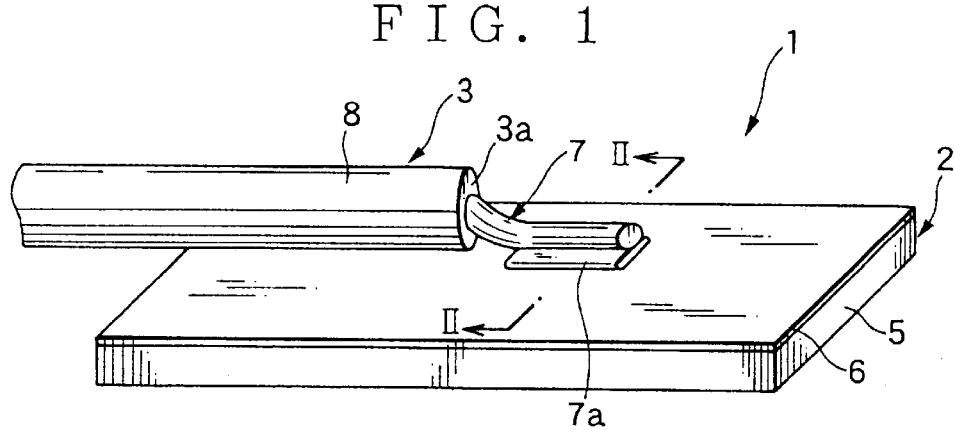
FIG. 1 is a perspective view illustrating a wiring module, which is assembled by using a process for joining metals according to a preferred embodiment of the present invention.
Figure 2:
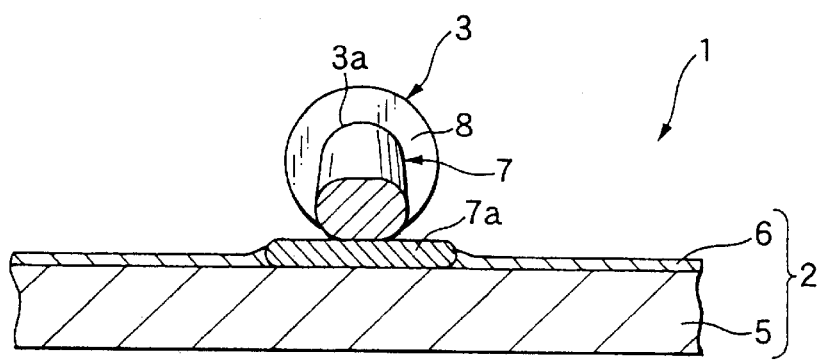
FIG. 2 is a cross sectional view taken along a II—II line in FIG. 1.

In the following, a process for joining metals according to a preferred embodiment of the present invention will be explained with reference to FIGS. 1–11. This process is a process for assembling a wiring module 1 shown in FIG. 1. As shown in FIGS. 1 and 2, the wiring module 1 has a metal piece 2 as the first metal, a coated electric wire 3, and a part 7a of a core wire 7 (explained later on).

The metal piece 2 is formed in a relatively thin plate-shape having a plate-shaped matrix 5 and a plated layer 6 formed on one surface of the matrix 5. The matrix 5 is made of an electrically conductive metal. In the figure as an example, the matrix is made of brass. For example, the plated layer 6 is made of tin or tin alloy. In the figure as an example, the plated layer 6 is made of tin.

The coated electric wire 3 is formed in a round-shape for the cross sectional view thereof. The coated electric wire 3 has a core wire 7, the cross section of which has a round shape, and a coating 8 for coating the core wire 7. The core wire 7 consists of one electrically conductive wire or a plurality of electrically conductive wires twist with each other.

The electrically conductive wire constituting the core wire 7 is made of an electrically conductive metal such as copper, copper alloy, aluminum, and aluminum alloy. In the figure as an example, the conductive wire constituting the core wire 7 is made of copper. The core wire 7 has flexibility. The coating 8 is made of synthetic resin having electrically insulating properties and flexibility.

The part 7a of the core wire 7 is formed being separated from the core wire 7. The part 7a consists of one electrically conductive wire or a plurality of electrically conductive wires twist with each other. The conductive wire constituting the part 7a is, of course, made of conductive metal. In the figure as an example, the conductive wire constituting the part 7a is made of copper.

In the wiring module 1, the part 7a of the core wire 7 is placed on the plated layer 6 of the metal piece 2 and another core wire 7 of the body of the coated electric wire 3 is placed on the part 7a. Thereby, the matrix 5 of the metal piece 2 is joined to the part 7a, to which the core wire 7 of the body of the coated electric wire 3 is joined.

Figure 3:
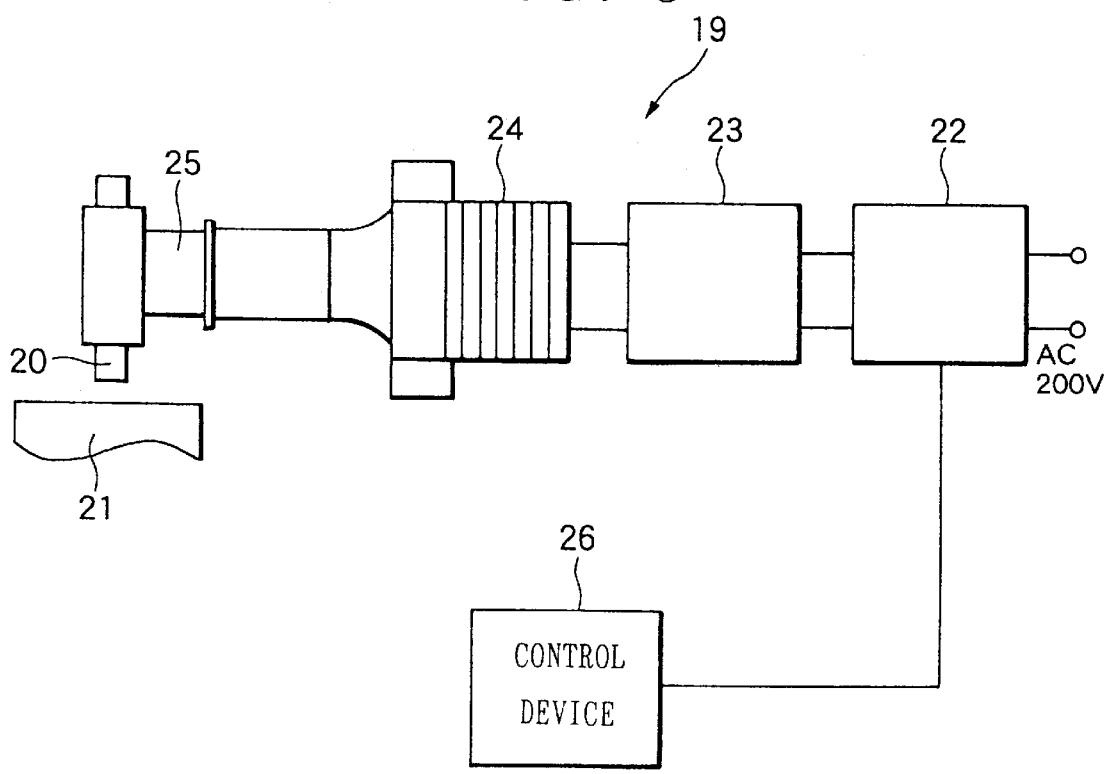
FIG. 3 illustrates a constitution of an ultrasonic welding device utilized for assembling the wiring module shown in FIG. 1.

The metal piece 2, the part 7a of the core wire 7 and the core wire 7 of the body of the coated electric wire 3 are fixed to each other by using an ultrasonic welding device 19 (shown in FIG. 3), thereby the wiring module 1 is obtained. As shown in FIG. 3, the ultrasonic welding device 19 consists of a voltage-variable power supply 22, generator 23, oscillator 24, hone 25, chip (or tool hone) 20, anvil 21 facing the chip 20, and control device 26.

The voltage-variable power supply 22 applies a voltage to the generator 23. The voltage-variable power supply 22 changes the voltage to be applied to the generator 23 in response to a command from the control device 26. The generator 23 oscillates the oscillator 24, to which the hone 25 is attached. The chip 20 is attached to an end of the hone 25. The control device 26 controls the operation of the ultrasonic welding device 19 by controlling the value of the applied voltage and the period of time for voltage application.

The ultrasonic welding device 19 puts objects to be welded to each other between the chip 20 and the anvil 21, then a pressure is applied thereto in the direction that the chip 20 and the anvil 21 approach to each other and then, the generator 23 oscillates the oscillator 24 so as to transmit the oscillation to the chip 20 through the hone 25. The ultrasonic welding device 19 gives an ultrasonic oscillation energy to the objects to be welded, which is put between the chip 20 and the anvil 21, thereby welding the objects to each other.

In this specification, the oscillation energy is defined as the energy that the ultrasonic welding device 19 gives to the objects to be welded when the objects are welded to each other. For example, the oscillation energy is the energy, which can be calculated by multiplying the value of electric power (watt) upon the voltage application by the period of time for voltage application.

When the wiring module 1 is assembled, that is, when the part 7a of the core wire 7 of the metal piece 2 is to be fixed to the core wire 7 of the body of the coated electric wire 3, a part of the coating 8 is removed in advance so as to expose the portion including the part 7a of the core wire 7. In the figure as an example, the coating 8 located at an end 3a of the coated electric wire 3 is removed.

As shown in FIG. 7, the metal piece 2 is placed on the anvil 21 so that the plated layer 6 faces the chip 20. The part 7a of the core wire 7 is placed on the plated layer 6 of the metal piece 2 and an end surface of the chip 20 comes into contact with the part 7a of the core wire 7. Thus, the metal piece 2 and the part 7a of the core wire 7 are put between the chip 20 and the anvil 21.

Thereafter, a pressure that is high almost enough to cut the core wire 7 is applied thereto in the direction that the chip 20 and the anvil 21 approach to each other, along arrows Pa1 and Pa2 shown in FIG. 8. Thereby, as shown in FIGS. 4 and 8, the part 7a is deformed from a round shape to an elliptic shape in the cross sectional view thereof. At this time, the force applied along the arrows Pa1 and Pa2 is larger than the force applied along arrows Pb1 and Pb2 (explained later on).

Thereafter, the ultrasonic welding device 19 is operated so that the voltage-variable power supply 22 applies the voltage to the generator 23, the generator 23 oscillates the oscillator 24, and the oscillation is transmitted to the chip 20 through the hone 25. At this time, the ultrasonic oscillation energy that the ultrasonic welding device 19 gives is high almost enough to melt the plated layer 6 due to the frictional heat between the plated layer 6 and the part 7a of the core wire 7. As is mentioned later on, this ultrasonic oscillation energy is higher than an ultrasonic oscillation energy that the ultrasonic welding device 19 gives when the core wire 7 of the body of the coated electric wire 3 is joined to the part 7a.

The frictional heat occurs between the part 7a of the core wire 7 and the plated layer 6 due to the oscillation, thereby a part of the plated layer 6 melts. Since the pressure is applied in the direction that the chip 20 and the anvil 21 approach to each other along arrows Pa1 and Pa2, the part 7a of the core wire 7 is deformed in the direction that the thickness of the part 7a is thinned, said thickness being the thickness of the part 7a in the direction that the chip 20 and the anvil 21 approach to each other or part away from each other, and a part of the melted plated layer 6 is removed from between the part 7a of the core wire 7 and the matrix 5.

Thereafter, the part 7a of the core wire 7 comes into contact with and makes the metallic bond with the matrix 5 in the solid phase thereof without melting. Since the force applied along the arrows Pa1 and Pa2 is large, the core wire 7 of the coated electric wire 3 is cut and the part 7a is separated from the core 7 of the body of the coated electric wire 3 as shown in FIG. 5. Thus, the core wire 7 is broken off and the part 7a of the core wire 7 is joined to the matrix 5 of the metal piece 2 by the ultrasonic welding as shown in FIG. 9. The first welding step includes that the part 7a of the core wire 7 is placed on the plated layer 6, the plated layer 6 is melted, the part 7a of the core wire 7 is joined to the matrix 5, and the part 7a of the core wire 7 is broken off from the body of the coated electric wire 3.

Figure 10:
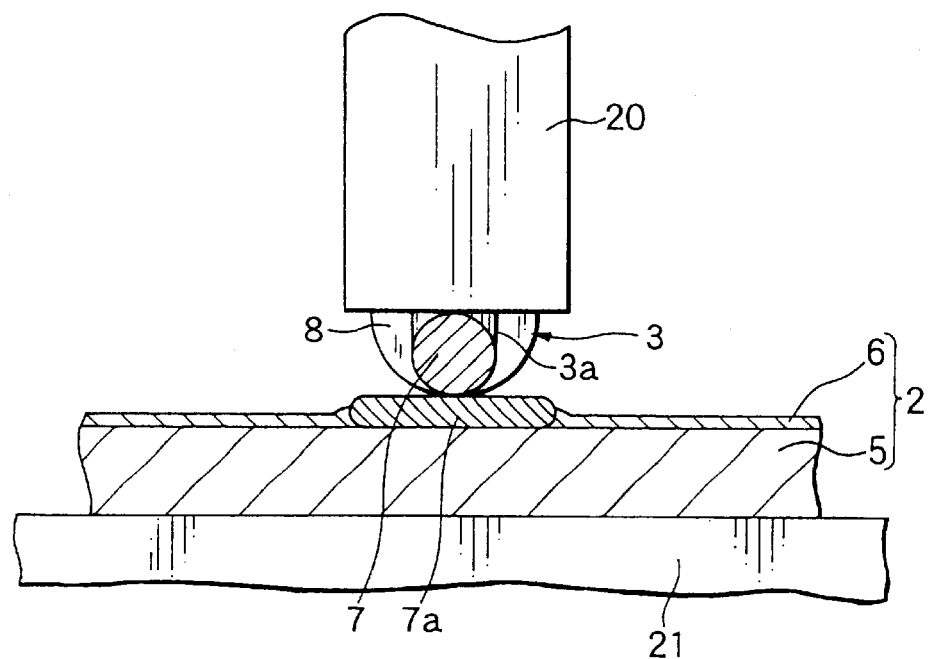
FIG. 10 is a cross sectional view illustrating a state that another core wire is placed on a part of a core wire, which has been joined to a matrix of a metal piece, when the wiring module shown in FIG. 1 is assembled.

As shown in FIG. 10, the operation of the ultrasonic welding device 19 is once halted, then another core wire 7 of the body of the coated electric wire 3 is placed on the part 7a of the core wire 7, which has been joined to the metal piece 2. The 7a of the core wire 7 and the another core wire 7 of the body of the coated electric wire 3 are put between the chip 20 and the anvil 21. At this time, the metal piece 2 is placed on the anvil 21 and the another core wire 7 of the body of the coated electric wire 3 comes into contact with the end surface of the chip 20.

Figure 11:
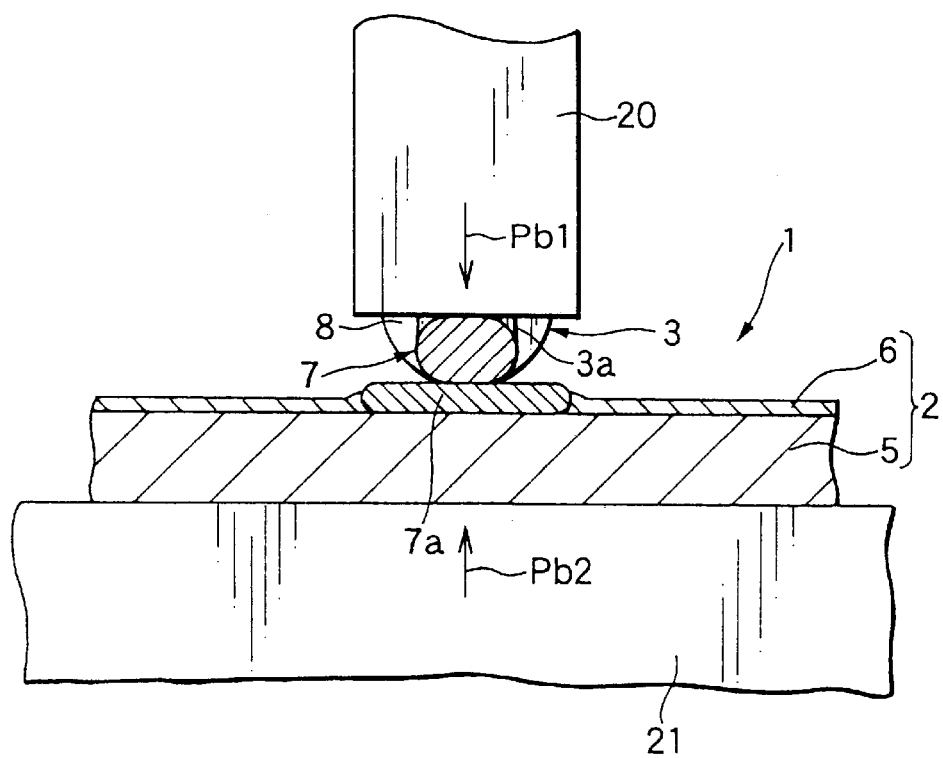
FIG. 11 is a cross sectional view illustrating a state that a part of a core wire, which has been joined to a matrix of a metal piece, and another core wire are pressed in the direction of approaching to each other when the wiring module shown in FIG. 1 is assembled.

Thereafter, a pressure is applied in the direction that the chip 20 and the anvil 21 approach to each other along the arrows Pa1 and Pa2 shown in FIG. 11. Then, as shown in FIGS. 6 and 11, the core wire 7 is deformed from a round shape to an elliptic shape in the cross sectional view thereof.

Thereafter, the ultrasonic welding device 19 is operated so that the voltage-variable power supply 22 applies the voltage to the generator 23, the generator 23 oscillates the oscillator 24, and the oscillation is transmitted to the chip 20 through the hone 25.

Then, the oscillation occurs between the part 7a joined to the metal piece 2 and the core wire 7 of the body of the coated electric wire 3, thereby the core wire 7 and the part 7a are joined to each other by the ultrasonic welding. Thus, the core wire 7 of the coated electric wire 3 is joined to the metal piece 2 through the part 7a, thereby the wiring module 1 is obtained. The second welding step includes that the another core wire 7 of the coated electric wire 3 is placed on the part 7a of the core wire 7 joined to the metal piece 2, and the core wire 7 and the part 7a are joined to each other.

The process for joining metals to assemble the wiring module 1 as described above is applicable, for example, when the core wire 7 of the coated electric wire 3 is joined to a terminal metal fittings as a metal, on the surface of which the plated layer made of tin and the like.

In the preferred embodiment, by the ultrasonic welding, the plated layer 6 is once melted and the part 7a of the core wire 7 of the coated electric wire 3 is joined to the matrix 5 of the metal piece 2. At this time, the core wire 7 is broken off and the part 7a is separated. Then, the another core wire 7 of the body of the coated electric wire 3 is joined to the part 7a by the ultrasonic welding.

Since the plated layer 6 is once melted, the 7a of the core wire 7 made of copper can be securely joined to the metal piece 2, on the surface of which the plated layer 6 made of tin that is hard to be joined is formed. Therefore, the core wire 7 of the coated electric wire 3 can be securely joined to the metal piece 2 through the part 7a.

Further, the ultrasonic oscillation energy utilized when the part 7a of the core wire 7 is joined to the matrix 5 (the first welding step) is higher than that utilized when the another core wire 7 of the coated electric wire 3 is joined to the part 7a of the core wire 7 joined to the matrix 5 (the second welding step). Furthermore, the force for the pressurization along the arrows Pa1 and Pa2 applied when the part 7a of the core wire 7 is joined to the matrix 5 (the first welding step) is larger than that applied when the another core wire 7 of the coated electric wire 3 is joined to the part 7a of the core wire 7 joined to the matrix 5 (the second welding step).

Consequently, by melting the plated layer 6, the part 7a of the core wire 7 can be securely joined to the matrix 5 of the metal piece 2. Further, when the core wire 7 of the coated electric wire 3 is joined to the part 7a, the core wire 7 of the body of the coated electric wire 3 can be prevented from being broken off.

With the construction of the present invention, the core wire of the coated electric wire can be securely joined to the first metal, on the surface of which the plated layer is formed, through the part of the core wire.

What is claimed is:

1. A process for joining metals, by which a core wire of a body of a coated electric wire is joined to a first metal, on the surface of which a plated layer is formed, comprising:

a first welding step, in which ultrasonic welding is carried out after placing a part of the the core wire of the body of the coated electric wire on the plated layer of the first metal, so that the plated layer is melted, the part of the core wire is joined to a matrix of the first metal, and the part of the core wire is broken off from the remaining core wire of the body of the coated electric wire; and a second welding step, in which an ultrasonic welding is carried out after placing a part of the remaining core wire of the body of the coated electric wire on the part of the core wire joined to the matrix in said first welding step, so that the two parts of the core wire of the body of the coated electric wire are joined to each other.

2. The process for joining metals according to claim 1, wherein ultrasonic oscillation energy used in the first welding step is higher than that used in the second welding step, and force for pressurization applied in the direction that the core wire and the first metal approach to each other in the first welding step is larger than that in the second welding step.

* * * * *